United States Patent [19]
Yang et al.

[11] Patent Number: 5,972,796
[45] Date of Patent: Oct. 26, 1999

[54] IN-SITU BARC AND NITRIDE ETCH PROCESS

[75] Inventors: Ming Yang, Richardson; Masahiro Kaida, Plano; Tom Lassister, Garland; Fred D. Fishburn, Richardson, all of Tex.

[73] Assignee: Texas Instruments Incorporated, Dallas, Tex.

[21] Appl. No.: 08/988,049

[22] Filed: Dec. 10, 1997

Related U.S. Application Data

[60] Provisional application No. 60/035,268, Dec. 12, 1996.

[51] Int. Cl.$^6$ ............... H01L 21/306; H01L 21/3065; B44C 1/22
[52] U.S. Cl. ............... 438/706; 438/710; 438/724; 438/725; 438/744
[58] Field of Search ............... 438/706, 710, 438/724, 725, 744, 737

[56] References Cited

U.S. PATENT DOCUMENTS

| | | | |
|---|---|---|---|
| 4,180,432 | 12/1979 | Clark | 156/643 |
| 4,227,975 | 10/1980 | Hartman et al. | 204/15 |
| 4,493,745 | 1/1985 | Chen et al. | 156/626 |
| 4,529,476 | 7/1985 | Kawamoto et al. | 156/643 |
| 4,872,944 | 10/1989 | Rufin et al. | 156/626 |
| 4,938,839 | 7/1990 | Fujimura et al. | 156/628 |
| 4,978,420 | 12/1990 | Bach | 156/643 |
| 4,985,112 | 1/1991 | Egitto et al. | 156/643 |
| 5,002,623 | 3/1991 | Loewenstein | 156/643 |
| 5,094,712 | 3/1992 | Becker et al. | 156/643 |
| 5,362,669 | 11/1994 | Boyd et al. | 437/67 |
| 5,433,823 | 7/1995 | Cain | 156/662.1 |
| 5,554,560 | 9/1996 | Hsue et al. | 437/69 |

*Primary Examiner*—Benjamin Utech
*Assistant Examiner*—Lan Vinh
*Attorney, Agent, or Firm*—Robby T. Holland; Carlton H. Hoel; Richard L. Donaldson

[57] ABSTRACT

A method for etching a semiconductor device (10) having BARC layer (22) and nitride layer (20) includes etching BARC layer (22) until reaching a first set point in the fabrication reaction chamber and then etching nitride layer (20) in-situ the fabrication reaction chamber immediately following etching BARC layer (22).

4 Claims, 2 Drawing Sheets

IN-SITU BARC AND NITRIDE ETCH PROCESS

This is a Non Provisional application filed under 35 USC 119(e) and claims priority of prior provisional, U.S. Ser. No. 60/035,268 of inventor Yang, et al, filed Dec. 12, 1996.

TECHNICAL FIELD OF THE INVENTION

The present invention relates to methods and systems for fabricating semiconductor devices and, more particularly, to a method for etching layers of a semiconductor device during fabrication and, even more particularly, to an in-situ process for performing both a BARC layer etch and a nitride layer etch of a semiconductor device in a single semiconductor device fabrication reactor chamber.

BACKGROUND OF THE INVENTION

In the formation of many types of semiconductor devices, a layer of an organic material called BARC (which is an abbreviation for Bottom Anti Reflecting Coating) is deposited over a nitride layer according to the design or pattern of a photolithographic mask. The purpose of the BARC layer is to provide a desired level of photolithographic resolution for critical dimensions of 0.35 βm or smaller. Once this step is completed, however, the BARC layer must be removed to form, for example, gates of a transistor in an integrated circuit. In addition to removing selected portions of the BARC layer, there is also the need to selectively remove portions of the nitride layer to form a transistor gate or similar structure.

The known way of removing selected portions of the BARC and nitride layers is to first etch the selected portions of the BARC layer in a first fabrication reactor chamber and then remove the semiconductor device from the chamber. Then, the etched semiconductor device is placed in a second fabrication reaction chamber where a nitride etch process takes place. This step removes the selected portion of the nitride layer.

Performing the etch of the BARC layer first in one chamber and the nitride etch in a second chamber often yields an unacceptable semiconductor device. Moreover, the logistical problems of working with two fabrication reaction chambers, as well as the time delays that the process causes, make the sequentially BARC layer etch and nitride layer etch a less than desirable way of fabricating the semiconductor device. Using known etch processes, however, prohibits combining the processes in a single fabrication reaction chamber.

SUMMARY OF THE INVENTION

In light of the above limitations, there is a need for a method that overcomes the limitations of known semiconductor device etch processes for etching BARC and nitride layers that result in poor CD control, unsatisfactory gate profiles, complicated fabrication processes and long production cycle times.

The present invention, accordingly, provides a combined in-situ BARC and nitride etch process that eliminates or substantially reduces limitations associated with known methods for etching semiconductor devices.

According to one aspect of the present invention, there is provided a method for etching a semiconductor device that includes the step of placing the semiconductor device in a fabrication reactor chamber, the semiconductor device having a BARC layer and a nitride layer. A next step is to etch a predetermined portion of the BARC layer from the semiconductor substrate until reaching a first set point in the fabrication reactor. A nitride etch process is then performed on a predetermined portion of the semiconductor substrate in-situ the fabrication reactor immediately following the BARC layer etching step. To complete the nitride etch process, an over-etch step then takes place.

A technical advantage of the present invention is that it provides an improved critical dimension control mechanism for forming features of semiconductor devices such as memory devices by improving the feature profiles. For example, with the present invention, a vertical feature profile of at least 88 degrees from the plane of the semiconductor substrate may be routinely achieved.

Another technical advantage of the present invention is that it gives a much simpler process, permitting the use of a single etch environment within a fabrication reactor to perform both the BARC layer etch and the nitride layer etch. This differs significantly from the known process of using two different etch environments for first performing the BARC layer etch process and then performing the nitride layer etch process. Associated with this technical advantage is a reduced production cycle time that makes possible the fabrication of a greater number of memory devices, such as DRAMs, for a given unit of time and given production capacity.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the figures like numerals being used to refer to like and corresponding parts of the various drawings.

Figure 1:
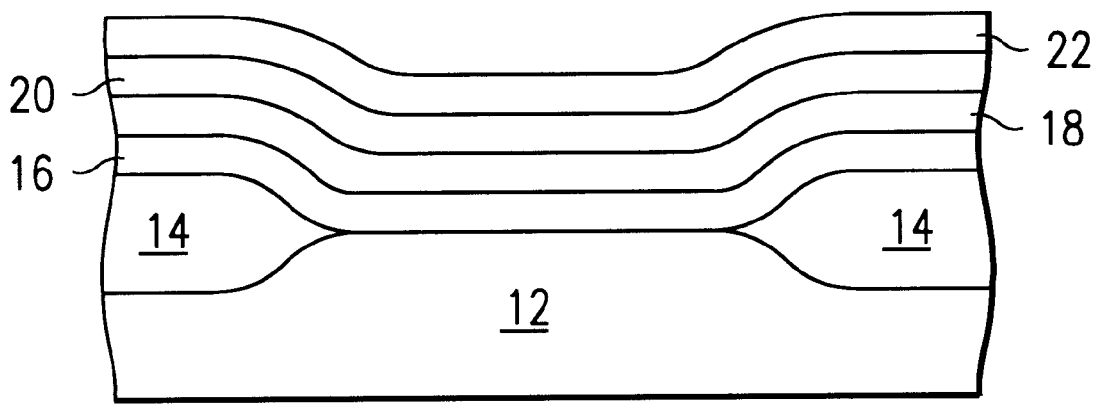
FIG. 1 shows a semiconductor device on which to apply the teachings of the present invention.
Figure 2:
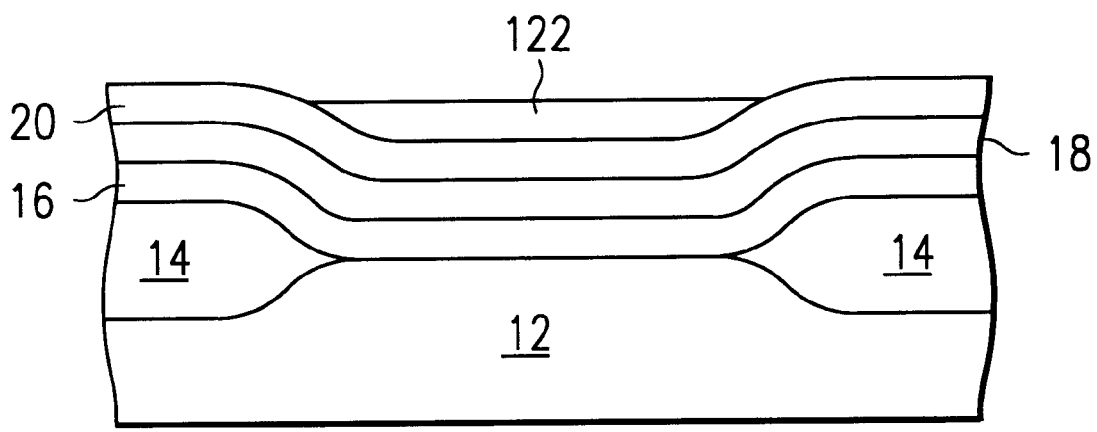
FIG. 2 illustrates the situation of an incomplete BARC layer etch resulting from conventional process techniques and to which the semiconductor device of FIG. 1 may be susceptible.

FIGS. 1 and 2 show an exemplary structure for memory cell that includes a BARC layer and nitride layer and to which the process of the present invention may be applied. In particular, memory cell 10 includes substrate 12 that includes local oxidation of semiconductor (LOCOS) regions 14. Covering substrate region 12 and LOCOS regions 14 is word line 16. Covering word line 16 is tungsten silicide layer 18. Nitride layer 20 covers tungsten silicide layer 18. BARC layer 22, which is an organic material, covers nitride layer 20.

The present invention provides a way to remove selected portions of BARC layer 22 in a combined continuous process that takes place in a single semiconductor reactor chamber. BARC layer 22 poses the challenge of not being uniform because it is an organic material. BARC layer 22 may be considerably deeper in a trough, such as trough 24 and considerably more shallow in an elevated region such as elevated region 26. Thus, a BARC layer etch process that may remove all of BARC layer 22 at elevated region 26, for example, will not remove all of the BARC in trough area 24. This can leave, for example, an unetched region such as region 28 of FIG. 2.

The etch process of the present invention shifts from a BARC layer etch to a nitride layer etch to first etch BARC layer 22 and then etch nitride layer 20. During the nitride etch step, a degree of BARC layer 22 over-etching occurs to remove the residual BARC portion, such as BARC region 28, for example. The third step in the preferred process provides an over-etch for any remaining portion of nitride layer 20 that has not as of that time been etched. Because the nitride layer etch step is highly selective to tungsten silicide, during the third step of the present invention, no etching of the tungsten silicide layer occurs. However, both the desired removal of BARC layer 22 and nitride layer 20 occurs.

The following exemplary process provides a procedure for forming the first gate BARC and nitrite etch according to the teachings of the present invention. The process description below explains three steps of what is generally a five or six step process. The first step of the general process is to perform photolithography to establish a pattern for the combined BARC layer 22 etch and nitride layer 20 etch.

In a fabrication reaction chamber, pumping of the plasma gasses occurs continuously for changing the process chemistry. Within this environment, the process of the present invention begins by first establishing a pressure of 55 militorr at a power of 450 watts. The preferred process chemistry includes $CF_4$ pumped at a rate of 20 standard cubic centimeters per minute (sccm), $CHF_3$ at a rate of 65 sccm, $O_2$ at a rate of 10 sccm and Argon at a rate of 95 sccm. This will continue until the end point, which is described below, is established with a cathode temperature of 40° C. and wall temperature of 60° C. During step one, the nitride layer etch rate is 1648 A per minute together with a BARC layer etch rate at 903 A per minute and a polysilicon etch rate of 382 A per minute.

The next step in the in-situ process establishes a pressure of 55 militorr and power of 250 watts within the reaction chamber. At this point, in the preferred embodiment $CF_4$ gas flow terminates, however, $CHF_3$ maintains at a level of 65 sccm, $O_2$ goes to a rate of 9 sccm, with Argon at a rate of 95 sccm. This step continues until the endpoint is reached which, again, is determined by emission spectroscopy. During this second step, a nitride etch rate of 985 A per minute is maintained along with a BARC etch rate of 514 A per minute and a polysilicon etch rate of 263 A per minute.

The last phase of this continuous combined BARC and nitride etch process of the present invention, the over-etching step, begins with maintaining pressure at 55 militorr and power at 250 watts within the reactor fabrication chamber. $CHF_3$ gas flow maintains at 65 sccm, with $O_2$ flow reducing to 7 sccm and Argon at a rate of 95 sccm. This continues until 130 percent of the endpoint of the above nitride layer 20 removal step is reached. During this step, the nitride layer 20 etch rate slightly increases to 990 A per minute, with BARC layer, to the extent that any remains, and polysilicon etch rates at 420 A per minute and 218 A per minute, respectively.

The endpoint of the first step is the determination that a sufficient amount of carbon nitride exists in the reaction chamber to indicate that most, if not all, of the BARC layer 22 has been removed. At this point, it is appropriate to shift to the nitride layer 20 etch second step. During the nitride etch, carbon nitride will be produced in the reaction chamber until most, if not all, of the nitride layer is removed. As the nitride layer is removed, less carbon nitride gas appears within the fabrication reaction chamber. Accordingly, the end point for the second step of the described process may be determined by the reduction of carbon nitride gas to some predetermined low point. Thereafter, the third step endpoint would be 130 percent reduction from the endpoint detection of the second step to provide a desired amount of over-etching.

The results of these three steps is the desired critical dimension bias of 0.0205 microns with a profile of 88.23 degrees. With a critical dimension bias of 0.0205, for example, if the print size is 0.5 microns, the print size may vary between 0.5205 and 0.4795. These results are clearly improvements over existing techniques.

The chemistry of the present invention provides improved process control and critical depth results, in part because it does not use $CF_4$ for the nitride layer 20 etch and nitride layer 20 over-etch steps. Instead, these steps only use $CHF_3$ and oxygen. This avoids undesirable etching of the gate area and yields both the critical dimension bias of 0.0205 microns and profile of 88.23 degrees in one example. Similar results can be routinely achieved.

In practicing the above method for the combined process of BARC layer etch followed by nitride layer etch, process variations may exist. For example, established test procedures require at least a 15 percent tolerance in the gas mass flow rate in order to maintain the desired plasma environment from the above-described gas mixtures. Accordingly, variations of this magnitude may exist in a technique that incorporate the general principals of the present invention.

Figure 3:
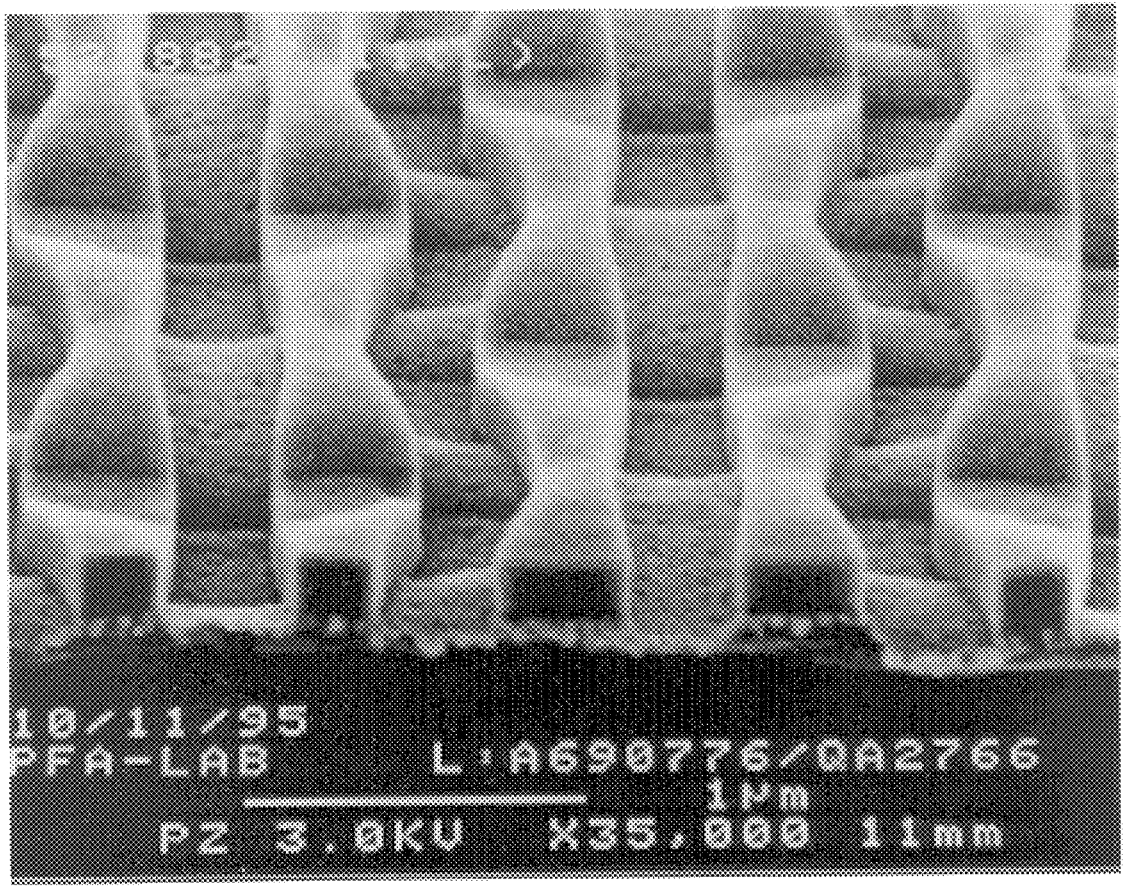
FIG. 3 provides a SEM photograph that depicts the results of etching a semiconductor device using the combined BARC etch and nitride etch process of the present invention.

To illustrate the results of a semiconductor device etch process of the present invention, FIG. 3 provides an SEM Photomicrograph of a gate array structure. Note the precise vertical profiles and sharp edges that the present invention makes possible.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method for etching a semiconductor device, comprising the steps of:
   placing a semiconductor device in a fabrication reactor chamber, said semiconductor device comprising a BARC layer and a nitride layer;
   etching a portion of said BARC layer substrate until reaching a first set point in the fabrication reactor; and
   etching a portion of said nitride layer semiconductor substrate in-situ said fabrication reactor immediately following said step for performing said BARC layer etching step.

2. The method of claim 1, further comprising the step of etching said BARC layer at a power of approximately 400 watts and said nitride etch process performing step occurs at a power of approximately 250 watts, further performing said BARC layer etching step and said nitride layer etching step at a pressure of approximately 55 militorr.

3. The method of claim 1, further comprising the step of performing said BARC layer etching step using the gases of $CF_4$, $CHF_3$, $O_2$ and Argon.

4. The method of claim 1, further comprising the step of performing said nitride layer etching step using the gases of $CHF_3$, $O_2$, and Argon.

* * * * *